United States Patent
Kuang et al.

(10) Patent No.: US 7,835,212 B2
(45) Date of Patent: Nov. 16, 2010

(54) METHODS AND ARRANGEMENTS FOR ENHANCING POWER MANAGEMENT SYSTEMS IN INTEGRATED CIRCUITS

(75) Inventors: Jente B. Kuang, Austin, TX (US); Hung Cai Ngo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 12/099,913

(22) Filed: Apr. 9, 2008

(65) Prior Publication Data

US 2009/0016141 A1    Jan. 15, 2009

Related U.S. Application Data

(63) Continuation of application No. 11/352,699, filed on Feb. 13, 2006, now Pat. No. 7,408,829.

(51) Int. Cl.
*G11C 5/14* (2006.01)

(52) U.S. Cl. ........... 365/226; 365/227; 365/228; 365/229; 365/233.1; 365/233.11

(58) Field of Classification Search ............ 365/226, 365/227, 228, 229, 233.1, 233.11
See application file for complete search history.

(56) References Cited

U.S. PATENT DOCUMENTS

| | | | |
|---|---|---|---|
| 4,151,611 A * | 4/1979 | Sugawara et al. ......... 365/227 |
| 5,729,498 A | 3/1998 | Yih et al. | |
| 5,765,002 A | 6/1998 | Garner et al. | |
| 6,079,008 A | 6/2000 | Clery, II | |
| 6,665,802 B1 * | 12/2003 | Ober ................. 713/320 |
| 6,944,084 B2 | 9/2005 | Wilcox | |
| 7,729,194 B2 * | 6/2010 | Zanders ............ 365/229 |
| 2007/0071151 A1 * | 3/2007 | Ebert ................. 375/354 |

* cited by examiner

*Primary Examiner*—Vu A Le
*Assistant Examiner*—Han Yang
(74) *Attorney, Agent, or Firm*—Libby Z. Toub; Schubert Law Group PLLC

(57) ABSTRACT

Methods and arrangements to configure power management systems for integrated circuits are provided herein. A group of IC components that are functionally distinct or have mutually exclusive and/or quasi-mutually exclusive, (ME/QME) operating patterns (i.e. alternate or partially overlapping duty cycles) can be powered with a single power cell. An integrated circuit design tool can identified components in an integrated circuit design that have the ME/QME operating patterns. These cells can be collocated in close proximity to each other and power management system components can be placed in this area such that a multiple signal processing cells can share a single power line and a single power cell. Such a configuration can greatly reduce the size of a power management system for an integrated circuit.

13 Claims, 5 Drawing Sheets

METHODS AND ARRANGEMENTS FOR ENHANCING POWER MANAGEMENT SYSTEMS IN INTEGRATED CIRCUITS

CROSS REFERENCE TO RELATED APPLICATION

Pursuant to 35 USC §120, this continuation application claims priority to and benefit of U.S. patent application Ser. No. 11/352,699, entitled "Methods and Arrangements for Enhancing Power Management Systems in Integrated Circuits", filed on Feb. 13, 2006, the disclosure of which is incorporated herein in its entirety for all purposes.

GOVERNMENT INTERESTS

This Invention was made with Government support under NBCH3039004, BGR W0132280, PERCS II. THE GOVERNMENT HAS CERTAIN RIGHTS TO THIS INVENTION.

FIELD

The present disclosure relates generally to computer added design tools and to power management systems for integrated circuits.

BACKGROUND

The performance of electronic equipment such as computers and communication devices continues to improve. Generally, designers strive to decrease the size and power consumption of such equipment, while increasing the speed and functionality of this equipment. Decreasing power consumption is a major technical issue facing the semiconductor industry. Two areas of power consumption that have been targeted by designers are losses due to device switching and losses associated with quiescent power consumption commonly referred to as "leakage power." Curtailing leakage power plays an important role in the design process. Leakage power is emerging as a new critical challenge in the design of high performance integrated circuits (IC)s.

More specifically, the portion of total power consumption of very large scale integration (VLSI) circuits that is caused by leakage currents is increasing dramatically as technology generations transition to processes that create smaller devices. This evolution is often referred to as technology scaling. Currently, power dissipation created by device switching encompasses a significant portion of total power consumption for ICs while leakage power accounts for another significant portion of the overall power dissipation within ICs. Leakage power is particularly important during standby operation of battery-powered, handheld devices and densely populated devices that have heat related problems.

Technology scaling relies on the use of low threshold voltage switching devices, such as transistors, to increase chip densities, where over a million transistors can be placed on an integrated circuit. Low threshold voltage switching devices are devices that generally can operate at lower supply voltages, dissipate less power during switching and operate at higher switching speeds than traditional devices. A significant drawback to these low threshold voltage devices is the relatively large leakage currents. In fact, as devices get smaller and smaller leakage currents increase at an exponential rate.

Leakage power is mainly comprised of gate and sub-threshold leakage currents. Gate leakage involves current that tunnels through the gate oxide to the drain and/or source of a transistor and sub-threshold leakage refers to current that flows between the drain and source terminals when a signal at the controlling gate has the transistor turned off. As technology continues to reduce the size of these low threshold voltage devices, leakage currents are expected to increase leakage power toward 40% to 50% of total power consumption, making leakage power a dominant source of power consumption for many integrated circuits.

Most designers utilize computer aided design (CAD) tools to create new ICs that have reduced power consumption. These tools have design "libraries" that provide a defined set of circuits components commonly referred to as cells that are building blocks utilized to create an IC design. During the design process designers may select cells of varying functions, shapes and sizes the library, place the cells into location in a grid format and connect the cells to create the integrated circuit design. Each cell can provide specific circuit functions, such as signal handling functions and when combined with other building blocks such a power system components, the designer can create a functional system. In such a configuration power system components can be distributed throughout an IC. Common design tools include Physical Compiler from Synopsys™ and First Encounter™ by Cadence Inc. To address power consumption issues, distributed power conservation systems have been incorporated into IC designs. Power conservation systems can control power delivery to portions of the IC when these portions are inactive. In particular, contemporary power conservation systems comprise transistors that are integrated into the design of the IC as headers and footers to isolate sections of an IC from power sources when these sections are inactive. Power transistors can be configured either as a header on the supply side of the power delivery system or as a footer on the return side of the power delivery system (i.e. between a ground plane and the cell). In some configurations both a header and footer are utilized to control power to a section of an IC.

However, implementing such a system creates significant challenges and problems. One challenge involves integration of the transistors into the IC design without adversely affecting the operation of the IC and without exceeding the available space on the IC. In addition, designers must determine when to turn sections of the IC on and off such that the speed of operation of the IC is not significantly impacted.

Another challenge is to design a power delivery system that does not result in increased power consumption. A typical power conservation system can require hundreds of power transistors (i.e. headers and footers), numerous control circuits, and hundreds of power lines. The power conservation system can consume a significant amount of power and, due to the area required by the power conservation system, increase the average lengths of conductive lines in the IC. Increasing the average lengths of the lines not only increases power consumption of the IC but can slow down the speed of operations within the IC. Designers must also carefully locate components of such a bulky system to control interference and provide efficient operation of the IC.

In addition to locating the additional devices and lines, there is a delicate balance between the area of the IC utilized for functionality and the area utilized by the power management system. Space on the IC is limited, and the area utilized by the power management system is not available to efficiently implement functionality. Historically, the actual benefits provided by power management systems are small when compared to the penalties incurred by implementing such a system.

Many electronic products or devices have functional systems on a single microchip or IC. This configuration is often referred to as a "system on a chip" (SoC). A SoC may have circuits such as static random access memory (SRAM), registers, branching logic, multiplexers, and decision logic that accept an input and create an output. Other circuits commonly found on microchips include pipeline circuits and a "one hot property" configuration where flip flops are chained in series and the "one hot" bit advances from flip flop to flip flop. In such configurations not all portions of the circuits operate concurrently during a specific time interval.

Additionally, banks of SRAM cells may share a read path, a write path and/or control lines and such a configuration requires specific portions of SRAM to be inactive when other portions are active. Reducing current to the inactive banks of SRAM can significantly reduce power consumption within an IC. This active-inactive dichotomy also occurs in register files multiplexers, and branching logic.

SUMMARY OF THE INVENTION

The problems identified above are in large part addressed by methods and arrangements provided herein to enhance power management systems that provide sleep modes for subsystems of integrated circuits (IC)s. In accordance with the present disclosure, a single power cell can deliver power to IC components that have mutually exclusive and/or quasi-mutually exclusive, (ME/QME) operating patterns. By design, specific components of an IC do hot operate or process data concurrently and thus have a mutually exclusive operating pattern. A quasi-mutually exclusive operating pattern occurs when components have concurrent operation for relatively short time periods (i.e. overlaps in operational cycles), but for the majority of the time do not operate concurrently. IC components having ME/QME operating patterns can be identified, grouped, collocated and connected to a power cell in an integrated circuit design such that the power cell can reduce the power to inactive components in the group in response to their operating pattern. Such a shared power delivery system (sharing a single power cell and power rail with multiple signal processing cells) can greatly reduced the amount of components required to provide a sleep mode to components within the integrated circuit.

In one embodiment, a first integrated circuit cell can be configured to be operable during a first time period and to be inactive during at least a portion of a second time period. A second integrated circuit cell can be configured to be inactive during at least a portion of the first time period and operable during the second time period. Thus, a first cell is on during the first time period while the second cell will typically be off during the majority of this period. Likewise, the second cell would be on during the second time period and the first cell would be off during the majority of the second time period. Such a ME/QME operating pattern allows a smaller power cell to control power to the first and second cell and provides a power conservation system that is nearly half the size when compared to systems that has a dedicated power cell for both the first and second signal processing cell.

In another embodiment, a power controller is provided to control the power cell and reduce the power supplied to the first integrated circuit component when it is inactive. The first component can be a static random access memory (SRAM) cell or bank of cells and the second component can be another SRAM cell or bank of cells where the banks can share read ports or write ports. Other components that commonly have ME/QME operation and can share a power cell include groups of register cells, branching circuits, multiplexers and pipeline circuits.

A system is also provided where a first integrated circuit component and a second integrated circuit component operate at least partially during non-overlapping time periods. A first power switch of the power cell is coupled to the first integrated circuit component to supply power to the first integrated circuit component, and a second power switch of the power cell is adapted to supply power to the second integrated circuit component. As stated above, a power control cell can provide control signals to the power cell in response to an operating pattern of the first integrated circuit component and the second integrated circuit component wherein the components can be SRAM, registers, branching logic, and pipeline configurations.

In another embodiment a method is provided for designing an integrated circuit wherein integrated circuit components that have ME/QME operating patterns are grouped and a power cell is sized and connected to the to grouped components in accordance with a set of design rules. After a design is created, operation of the integrated circuit can be simulated and it can be determined if the design meets predetermined parameters. When the design does not meet such a criteria the design layout can be re-configured.

In yet another embodiment a method for controlling power to components within a circuit is provided. A first integrated circuit component is powered during a first time period utilizing a first switch in a power cell and power supplied to the first integrated circuit component is suppressed during at least a portion of a second time period utilizing the first switch in the power cell. A second integrated circuit component is powered during a second time period utilizing a second switch in the power cell and power supplied to the second integrated circuit component is suppressed during at least a portion of the first time period utilizing a second switch of the power cell. As stated above the first and second integrated circuit component can be signal processing cell that operate in a ME/QME manner.

BRIEF DESCRIPTION OF THE DRAWINGS

Advantages of the invention will become apparent upon reading the following detailed description and upon reference to the accompanying drawings in which, like references may indicate similar elements.

DETAILED DESCRIPTION OF EMBODIMENTS

The following is a detailed description of novel embodiments depicted in the accompanying drawings. The embodiments are in such detail as to clearly communicate the subject matter. However, the amount of detail offered is not intended to limit anticipated variations of the described embodiments, but on the contrary, the claims and detailed description are to cover all modifications, equivalents, and alternatives failing within the spirit and scope of the present teachings as defined by the appended claims. The detailed descriptions below are designed to make such embodiments understandable to a person having ordinary skill in the art.

In a specific embodiment of the present disclosure, a design tool can identify components or signal processing cells (SPCs) in an integrated circuit design that operate in a functionally distinct manner and group such components. The functionally distinct operation can be a mutually exclusively and quasi-mutually exclusively (ME/QME) operating pattern where the components have alternate or partially overlapping duty cycles. The grouped SPCs can include components of an integrated circuit such as banks of SRAM, multiplexers, and/or register files that share control lines and outputs. The process of identifying SPCs that have functionally distinct or ME/QME operation can involve analyzing timing configurations, logic flow configurations and/or operating patterns of SPCs within the IC.

In one configuration, five SPCs have a ME/QME operating pattern, a twenty percent duty cycle and have substantially similar peak power consumption. These five SPCs can share a single power cell and power line that is sized based on the power requirements of a single SPC in the group. This allows a single power cell to replace the five power cells of equal size that would be required in traditional designs.

During an IC design process a power cell can be placed in the area proximate to the collocated SPCs and interconnect with the SPCs. As a result, a single power cell can supply power, via virtual power lines or power rails, to multiple SPCs. In some embodiments, the designer or design tool may even locate the cells that operate ME/QME in close proximity to power delivery resources to minimize lengths of lines. Additionally, the group of identified SPCs may share power control components such as power rails, power distribution lines, control lines and power controller cells. Therefore, in many embodiments, the power management system components and interconnections may be greatly reduced.

Generally, methods and arrangements for improving the performance of power management systems within an IC are provided herein. While specific embodiments will be described below with reference to particular circuit or logic configurations, those of skill in the art will realize that embodiments may advantageously be implemented with other configurations.

Figure 1:
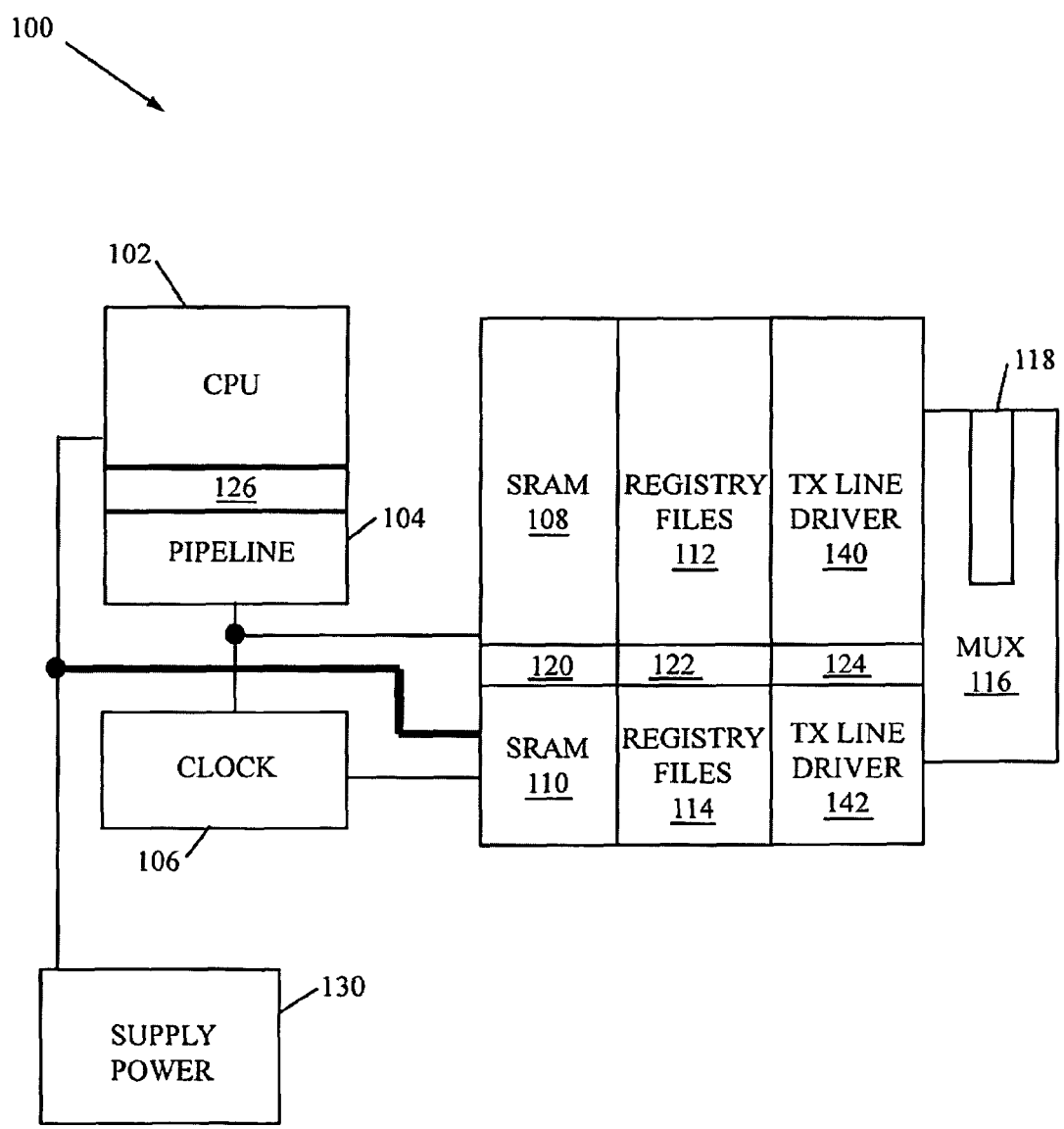
FIG. 1 depicts an embodiment of a data processing system including a CPU that utilizes registry files and memory banks and other circuits that share power distribution components.

Now turning to FIG. 1, a block diagram of a data processing system 100 that can be configured on an integrated circuit is illustrated. The data processing system 100 can include a central processing unit (CPU) 102, power supply 130, a master clock 106, a first bank of static random access memory (SRAM) 108, a second bank of SRAM 110, a first set of registry files 122, a second set of registry files 114, a first bank, of transmission line drivers 140, a second bank of transmission line drivers 142 and a multiplexer 116. The CPU 102 can have internal components that process data sequentially and form a pipeline configuration 104.

SRAM banks 108 and 110, multiplexer 116, transmission line drivers 140 and 142 and registry files 112 and 114 are examples of components or building blocks that can be utilized to create an IC design. Such components are often referred to as cells; however components may be formed from multiple cells and a single cell may have multiple grouped components. Components such as SRAMs 108 and 110, registry files 112 and 124, line drivers 140 and 142 process signals and are generically referred to herein as signal processing cells (SPCs). A cell that processes data in an analog or digital format, controls circuit operation or otherwise alters a signal in time, space or value is also referred to herein as a SPC.

Power supply 130 can supply regulated power to power cells 118, 120, 122, 124, and 126 (118-126). Power cells 118-126 and power rails can be shared by SPCs that have a ME/QME operating pattern or are functionally distinct. SRAM bank or cell 108 can be configured to be operable during a first time period and to be inactive during at least a portion of a second time period and SRAM bank or cell 110 can be configured to be inactive during at least a portion of the first time period and operable during the second time period. A time period may be determined based on a read cycle or a write cycle.

In some configurations operational overlap or quasi-mutually exclusive operation of SPCs may be required to avoid processing errors. Thus, SRAM cell 108 may be on during the first time period while SRAM cell 110 will typically be off for the majority of this period. Likewise the SRAM cell 110 would be on during the second time period and SRAM cell 108 would be off during the majority of this time period. Thus, components of an integrated circuit can operate at least partially during non-overlapping time periods. Such a time staggered powering of cells with quasi-mutually exclusive operation still allows a single compact power switch cell to provide power to multiple SPCs. When multiple SPC such as five SPCs can share a power cell the size of a distributed power conservation system can be reduced as much as four times from a traditional configuration.

In accordance with a specific embodiment, SPCs that operate ME/QME can be identified, grouped, arranged and located such that they can share at least one power management resource such as a power rail and power cell. As is illustrated, power cells 118-126 can be placed between circuits that have ME/QME operating patterns such as between SRAM 108, SRAM 110, between register file components 112, and 114, within multiplexer cell (118) and between transmission line driver components 140 and 142.

The power cells 118-126 can have a power transistors or switches that can switch and suppress the current provided to inactive cells. For SPCs with quasi-mutually exclusive operating patterns, more than one SPC in the identified group will require power during the "operational overlap." Thus, power cells 118-126 can provide power to multiple SPCs in a group of SPCs that have quasi-mutually exclusive operation or function concurrently for relatively short periods of time. Power can be supplied in a staggered fashion to SPCs having the overlapping duty cycles such that the average power supplied by a power cell is within capacity of the power cell.

Cells having ME/QME operation can be identified in many ways. In a specific embodiment, a design layout may dictate that during certain time intervals, specific cells are active while other cells are inactive due to how signals flow through, or are processed by, an IC. In another embodiment, it can be determined that when specific functions are occurring, other possibly complementary functions, are not being performed.

In yet another embodiment, timing diagrams can be utilized to identify when cells or groups of SPCs have ME/QME operation.

ME/QME operation of SPCs also occurs in configurations commonly referred to as pipeline configurations, wherein one SPC passes its result(s) to a downstream SPC and the downstream SPC passes its result downstream and so on. Additionally, ME/QME operation nearly always occurs when the signal flow branches to one SPC, leaving a complementary SPC idle. ME/QME also phenomenon commonly occurs in a multiplexer.

Figure 2:
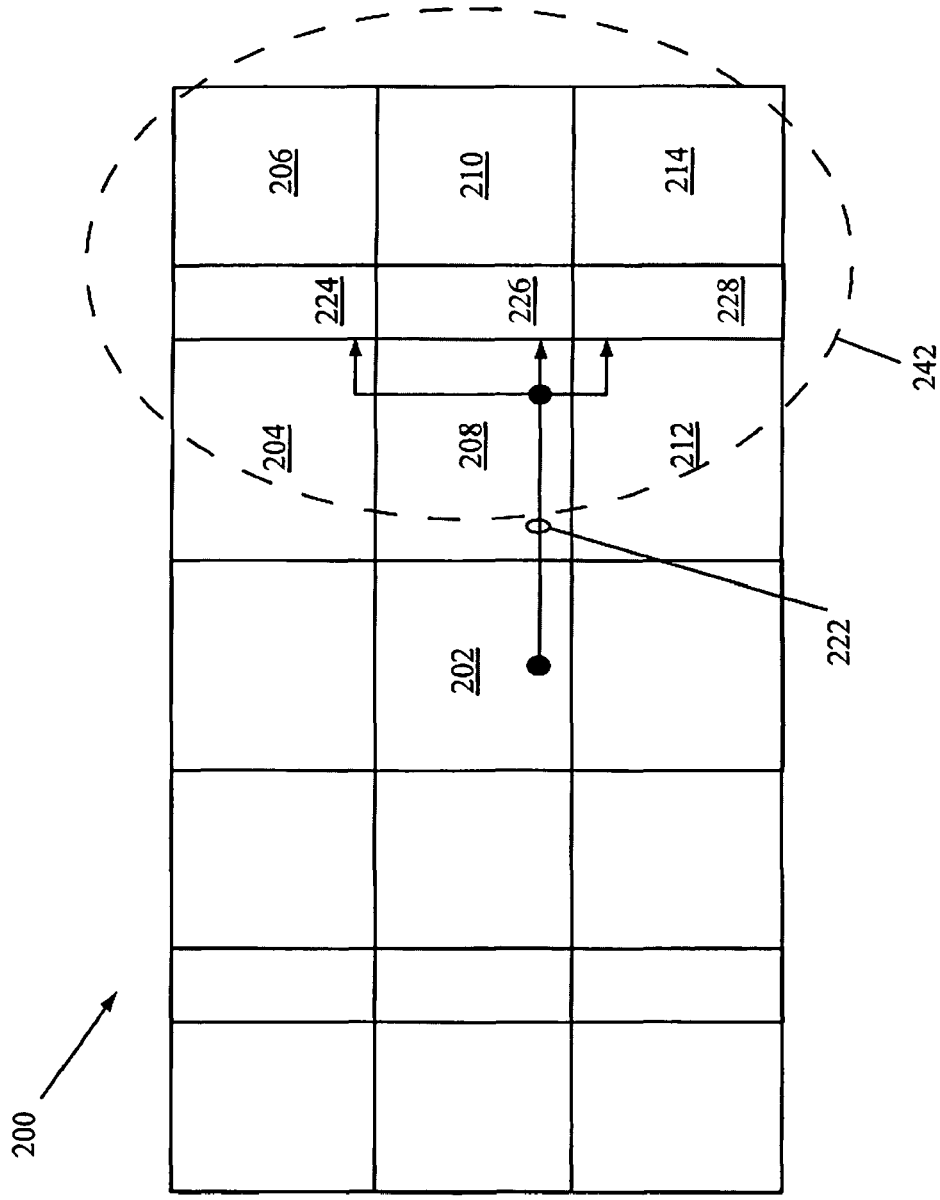
FIG. 2 illustrates an embodiment of signal processing components integrated into a grid, such that the components can share power management resources.

Turning now to FIG. 2, a configuration for an integrated circuit design layout having a "grid architecture" that provides a portion of a memory bank is provided. The layout illustrated has building block components or cells that are placed into a grid 200. The grid 200 can be displayed to a user via a graphical user interface such as a grid provided by many integrated circuit design tools.

In accordance with many circuit design tools, building block components such as cells, circuits, sub-circuits, devices, function blocks, cells, or portions of cells can be placed in the grid 200 by a designer. These building blocks of cells can perform a single function, a partial function or multiple functions during operation. For example, a cell could perform as a register, a memory component, a sub-array, a transmitter for a transmission line, a multiplexer, a buffer, or a clock driver. Cells can be classified based upon the type of function they provide or the time frames within which they operate. Hundreds or even thousands of types of SCPs are typically available as building blocks for a designer.

In FIG. 2 a portion of a design layout of an IC is provided in accordance with a distributed control, resource sharing embodiment of the present disclosure. It can be appreciated that many cells within an integrated circuit are idle at any given time. Such a phenomenon gives rise to groups of SPCs that can be identified as having ME/QME operation. As stated above, some cells within the integrated circuit operate during a specific time interval, while other cells, due to operating patterns, are inactive during this time interval.

Thus, in a specific embodiment when it is determined (possibly by combinational logic in a power cell) that a SPC in a group of SPCs having ME/QME operating patterns is processing data, power cell such as powers 224-228 can determine what cells are idle and suppress or control the power being supplied to the idle SPCs. When the operating patterns of SPCs have overlaps, a single power cell can be sized such that it can simultaneously provide power to multiple SRAM banks for relatively short periods of time.

In FIG. 2 cells having ME/QME operation have been placed in a target area 242 and components of the power management system such as power cells are shared between SPCs. SPCs 204, 206, 208, 210 212, and 214 (SPCs 204-214) can be placed in the grid 200 as provided by a graphical user interface of a computer aided design tool. SPCs 204-214 generally have at least one signal input and at least one signal output. Numbered grid locations indicate areas in the grid 200 where cells have been assigned to grid locations and un-numbered areas indicate areas in the grid 200 that are available for cell placement.

In a specific embodiment, power control cell 202 can control the operation of power cells 224, 226, and 228 (power cells 224-228) via power feeds 222. In the embodiment illustrated, SPCs 204 and 206 have been identified, grouped and placed into target area 242 due to their operating patterns. Power cell 224 had been positioned proximate to SPCs 204 and 206 such that SPC 204 and 206 can be powered by power cell 224.

In the illustrated embodiment SPCs 204, 206 208, 210 212 and 214 can be interconnected to form at least a portion of a pipeline configuration, wherein data is processed sequentially by SPCs. A signal can enter SPC 204, be processed by SPC 204, be sent downstream to SPC 206 for processing, and then be sent to SPC 208, and so on. Thus, ME/QME operation can occur because generally, when SPC 204 is active SPCs 206 and 208 are idle and when SPC 206 is active SPCs 204 and 208 are inactive.

Target area 242 can be a location in an IC design that is selected for placement of SPCs and power cells based oh available space and efficient access to components of a power management system (i.e. a power control cell 202 and power line 222). SPCs having ME/QME operation can be positioned in the target area 242 and interconnected in response to a set of design rules. If SPCs being placed in the target area each have dedicated power cells, these power cells can be integrated to form a single power cell. Integration of such cells can significantly reduce the size and overhead of a system required to manage power consumption in an integrated circuit.

In a specific embodiment, the power control cell 202 can control a plurality of power transistors within power cells 224-228. Power transistors are commonly referred to as "headers" or "footers" depending on their placement. Power control can be achieved based on signals from a master clock. In another embodiment, each power cell 224-228 can have logic that is connected to SPCs or a data bus and based on detected operation of at least one SPC, the power cell can activate power to the appropriate SPC(s). Further, the power control system can incorporate combinational logic and "sniff" the activity of the SPCs while utilizing known operating patterns to control the power to specific SPC cells. Accordingly, power can be provided to SPCs that are processing signals and power can be suppressed for SPCs that are not processing signals.

The configuration illustrated allows one power line 222 to feed a plurality of power cells 224, 226 and 228 and, if necessary a single power control cell and control line to provide switched power to many SPCs. Only a small portion of an IC is illustrated, and numerous power delivery configurations such as the one illustrated can be distributed throughout many locations of an IC. A numbering series has been implemented in FIGS. 2-6, wherein the last digit of the call out identifies cells that have similar operating functions. For example, SPC 204 of FIG. 2 can be considered functionally similar to cell 304 of FIG. 3, 404 of FIG. 4, 504 of FIG. 5 and 604 of FIG. 6.

Figure 3:
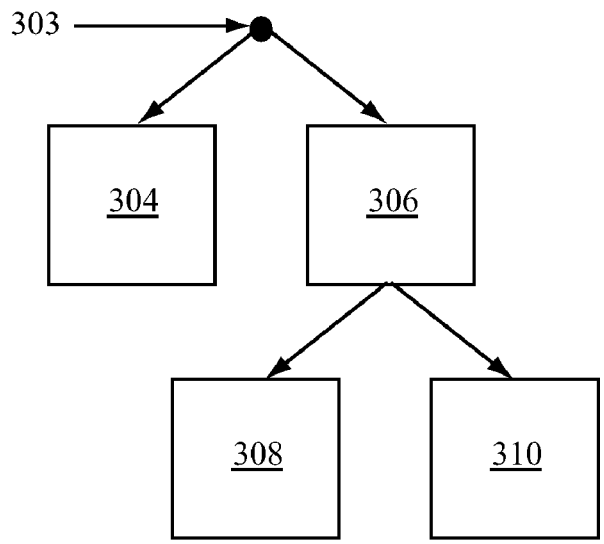
FIG. 3 depicts a signal flow that can occur between cells within an integrated circuit.

FIG. 3 illustrates signal processing cells 304, 306, 308, and 310 (SPCs 304-310) and a signal flow that can occur between the SPCs. More specifically FIG. 3 illustrates a signal flow that can occur between SPCs 304-310 to give rise to ME/QME operation of cells. The exemplary signal branching configuration provided requires the signal flow to branch from an origination point 303 to either SPC 304 or SPC 306. Further, when the signal branches to SPC 306, and after the signal is processed by SPC 306, the signal again branches to either SPC 308 or SPC 310. Thus, the operating pattern of the block diagram of FIG. 3 can define components of an IC that have ME/QME operation. In some configurations SPCs 304 and 306 may have to be powered simultaneously prior to the arrival of the signal, possibly to be ready for the incoming signal and thus the group of SPCs would not have mutually exclusive operation but could have quasi-mutually exclusive operation.

Figure 4:
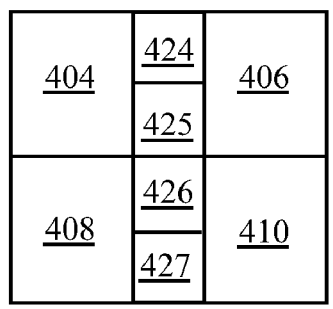
FIG. 4 illustrates a way to configure cells with specific signal flows such that the cells can share power management components.

Referring to FIG. 4, SPCs 404, 406, 408 and 410 (404-410) are depicted in a configuration where SPCs 404 and 406 operate in a ME/QME manner and share power cell 424. Similarly, SPCs 408 and 410 operate in a ME/QME manner and share cell 426. As discussed above, because SPCs 404-410 have a ME/QME operating patterns, SPCs 404-410 can be moved in close proximity to one another and configured such that they share one or two power cells (i.e. 425 and 426). In the configuration depicted, power cell 424 can contain transistors that are switched to deliver power to SPC 404 and 406 in an alternating or time staggered manner.

A shared power cell such as power cell 424 can have a first power transistor or header that is switched to feed SPC 404 and a second power transistor that is switched to feed SPC 406 according to their operating pattern. It can be appreciated that placing SPCs 404-410 proximate to power cells 424 and 426 provides a configuration with a reduced overhead because, in such embodiments, it can eliminate power switches and power lines in existing designs.

Figure 5:
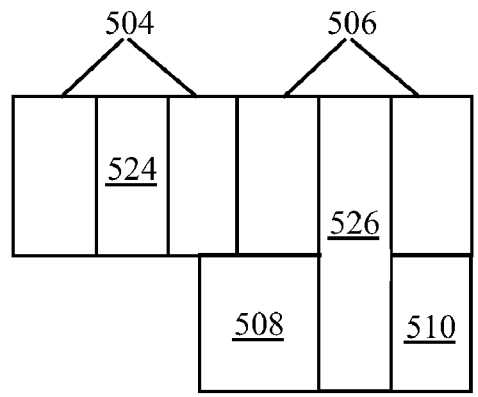
FIG. 5 depicts another way that the cells can share power management resources.

Referring now to FIG. 5, another embodiment for integrating the SPCs to provide the signal flow disclosed in FIG. 3 is illustrated. In FIG. 5, SPCs 504 and 506, and have been divided into two cells and power cells 524 and 526 has been integrated between the cells. As described above, the signal can flow to either SPC 504 or to SPC 506 and when the signal flows through SPC 506 it can exit SPC 506 and flow either to SPC 508 or to SPC 510.

SPC 504 can operate in a ME/QME manner with SPC 506, 508 and 510 and SPCs 506 can operate in a ME/QME manner with SPCs 504, 508, and 510. Further, SPC 510 can operate in a ME/QME manner with SPC 508, 506, and 504. Based on such an operating pattern SPCs 406, 408, and 410 can share a single power cell. In the illustration, two power cells 524 and 526 provide power to four SPCs (i.e. 504, 506, 508 and 510).

Figure 6:
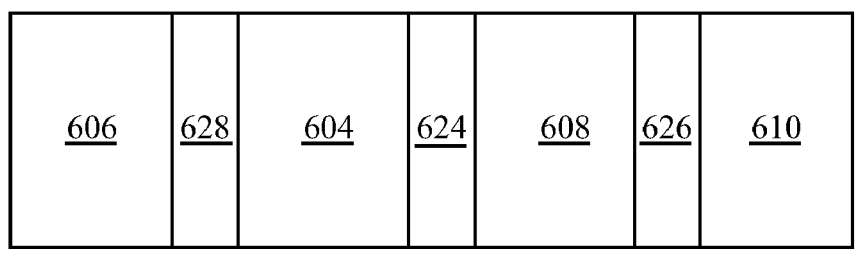
FIG. 6 illustrates yet another way that the cells can share power management resources.

Referring to FIG. 6, another embodiment of a power management layout having power resource sharing is provided. In FIG. 6, SPCs 604, 606, 608, and 610 can have the same operating pattern described above and can be placed on the same row in a target area. Power cell 628 can be placed between SPCs 604 and 606, power cell 624 can be placed between SPCs 606 and 608, and power cell 626 can be placed between SPCs 608 and 610. Each SPC can share the adjacent power cell. The power cells can supply to SPC on either side of the SPC. The configuration illustrated is also effective when supplying switched power to a pipeline process, where a signal is processed sequentially by SPC 606, 604, 608 and 620 respectively.

A control signal can be provided to the power cells 628, 624 and 626 according to the operating sequence of SPC 604, 606, 608 and 610. The "row" type embodiment illustrated in FIG. 6 can provide an integrated circuit layout that is easy to control, consumes less power and operates at faster clock speed due to the proximity of the devices. In other embodiments the "linear" placement of cells can be done vertically to increase the efficiency of the IC layout because bit lines and read/write lines generally are placed vertically (top to bottom of the page) in a design.

Referring to FIG. 6, another embodiment of a power management layout having power resource sharing is provided. In FIG. 6, SPCs 604, 606, 608, and 620 can have the same operating pattern described above and can be placed on the same row in a target area. Power cell 628 can be placed between SPCs 604 and 606, power cell 624 can be placed between SPCs 606 and 608, and power cell 626 can be placed between SPCs 608 and 620. Each SPC can share the adjacent power cell. The power cells can supply to SPC on either side of the SPC. The configuration illustrated is also effective when supplying switched power to a pipeline process, where a signal is processed sequentially by SPC 606, 604, 608 and 620 respectively.

A control signal can be provided to the power cells 628, 624 and 626 according to the operating sequence of SPC 604, 606, 608 and 620. The "row" type embodiment illustrated in FIG. 6 can provide an integrated circuit layout that is easy to control, consumes less power and operates at faster clock speed due to the proximity of the devices. In other embodiments the "linear" placement of cells can be done vertically to increase the efficiency of the IC layout because bit lines and read/write lines generally are placed vertically (top to bottom of the page) in a design.

Figure 7:
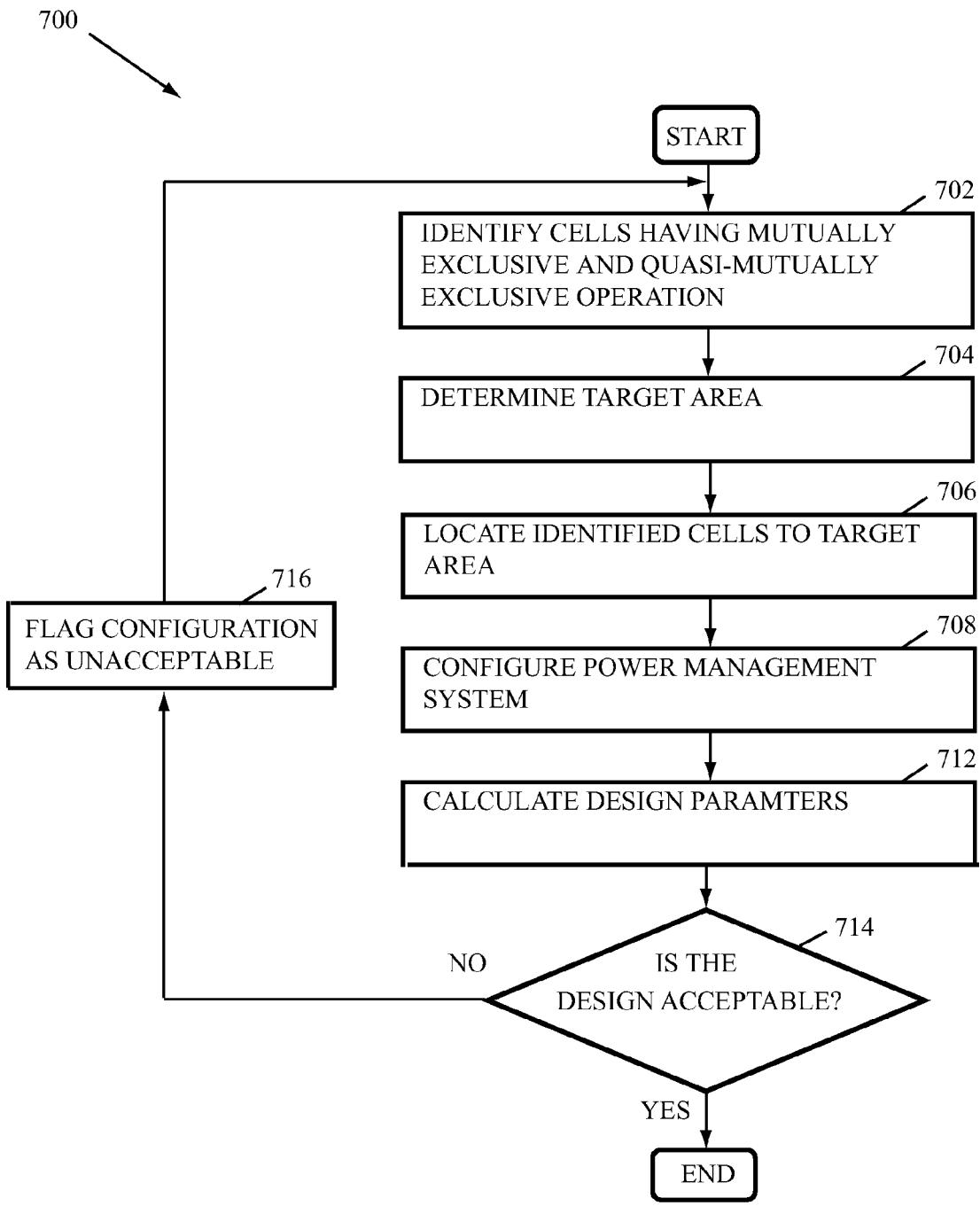
FIG. 7 illustrates a flowchart of an embodiment for configuring a power management system in an integrated circuit such that portions of SRAM or register files can share power management system components.

Referring to FIG. 7, an exemplary method for implementing a power management system within an integrated circuit (IC) is provided. The method allows signal processing cells (SPCs) to share power resources within the IC. As stated above, ICs can be configured by interconnecting thousands of building blocks or cells, wherein each cell provides at least a portion of a function. As illustrated by block 702, components or SPCs having ME/QME operation are identified. SPCs having such operating patterns can be identified by locating pairs or groups of cells that do not operate concurrently and/or do not operate concurrently for extended periods of time.

Identification of such SPC operation can be provided by a design tool wherein the design tool can identify the SPCs based on a set of rules and criteria. As described above, the rules and criteria can include analyzing the functions provided by SPCs or operating patterns such as a pipeline configuration, sequential processing, and signal branching; or by analyzing clocking or circuit timing including adjacent clock stages of an integrated circuit design.

As depicted by block 704, a target area on the integrated circuit can be determined based upon where the SPCs and at least one power cell can be placed. Many criteria could be utilized to determine the target area including available space, proximity with other interacting cells and proximity to power management components. To allow groups of cells to be placed in the target area, relocation of previously placed cells may be required to clear a target area As illustrated by block 706, SPCs identified as having ME/QME operation can be located or re-located to the target area. Block 708 depicts configuration of power management system components to address the requirements of the SPCs in the target area. At this stage analysis tools can be utilized to optimize multiple design parameters. For example, a power cell that supplies a group of SPCs can be sized responsive to the SPC that has the highest power consumption. In other embodiments, the power cell can be sized based on the peak or average power consumption required during an operational timing overlap of SPCs. Thus, a power cell can be integrated with SPCs utilizing CAD based design tools and rules. Integrating can include selecting, placing, configuring and connecting the power cells with SPCs, data busses, power lines, power busses or other components. The design tool can also ensure that the final design layout complies with a set or design rules for manufacturing and testing. These features can be provided by the design tool in an automated fashion or these operations could be manually selected or performed manually by a designer.

As illustrated by block 712, after the SPCs are integrated into the target area, many different analysis tools can be utilized to determine the quality or robustness of the design. A set of minimum performance, manufacturability and testability guidelines can be known or predetermined. Accordingly, results of an analysis of the design can be compared to these predetermined parameters. Specific parameters to be analyzed can include circuit timing and power consumption.

As illustrated in decision block 714, the results of the analysis are compared against the predetermined design parameters. When the results of the analysis meet or exceed the predetermined parameters, the process can end. On the other hand, when the results of the analysis do not meet the predetermined parameters, the configuration analyzed can be flagged as a non-working configuration as is illustrated by block 716. Components of the non-working configuration can be "un grouped" and the process can proceed to regroup components as illustrated by block 702.

Figure 8:
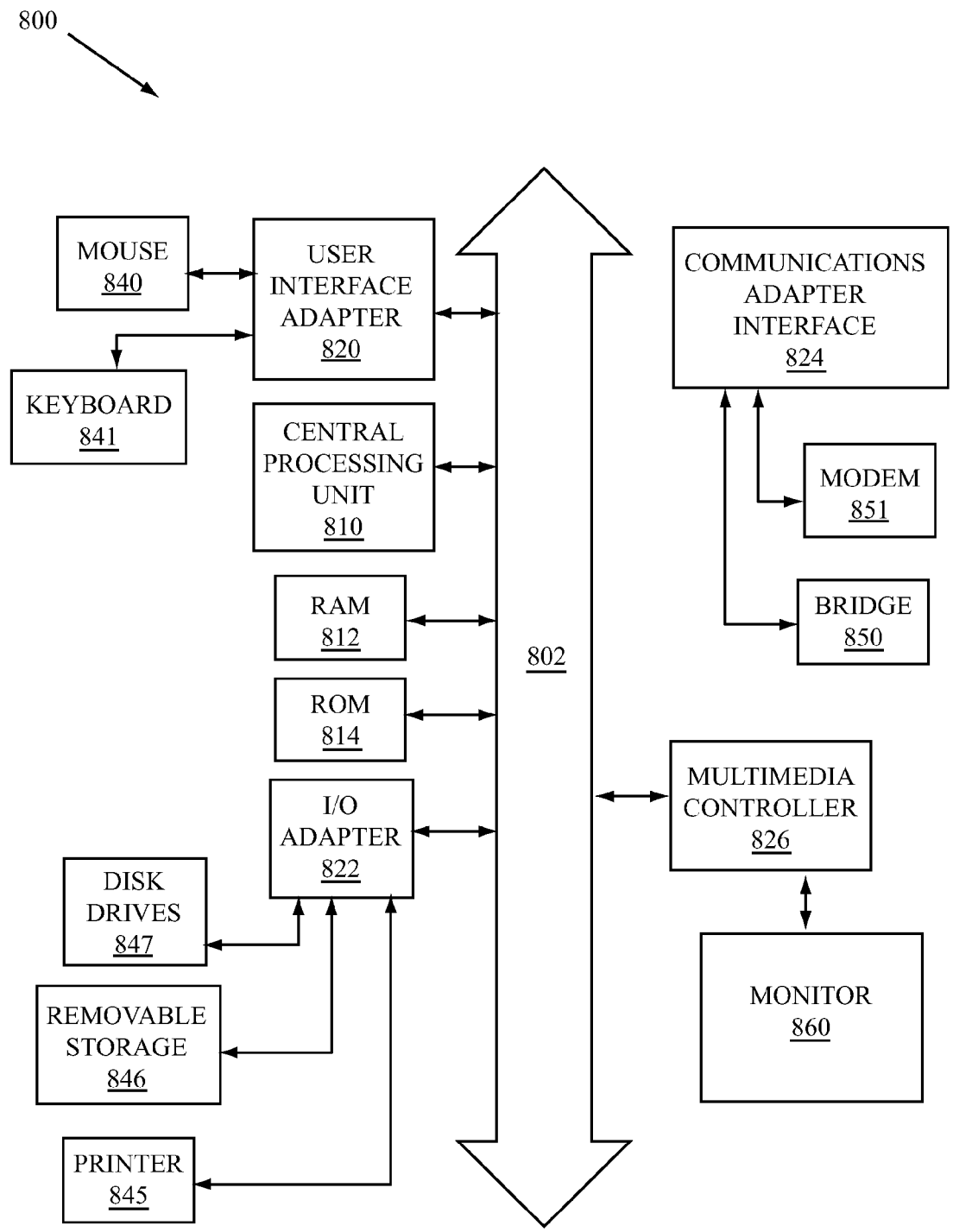
FIG. 8 depicts a computer system that could be utilized to implement the methods described herein.

FIG. 8 illustrates, in a block diagram format, a processing device such as a personal computer system 800. The computer system 800 is illustrated to include a central processing unit 820 that may be a conventional proprietary data processor, memory including random access memory 822, read only memory 824, and input output (I/O) adapter 822, a user interface adapter 820, a communications interface adapter 824, and a multimedia controller 826.

The I/O adapter 822 is connected to and controls disk drives 847, a printer 845, removable storage devices 846, as well as other standard and proprietary I/O devices. The user interface adapter 820 may be a specialized I/O adapter. The adapter 820 as illustrated is connected to a mouse 840 and a keyboard 842. In addition, the user interface adapter 820 may be connected to other devices capable of providing various types of user control, such as touch screen devices (not shown).

The communications interface adapter 824 is connected to abridge 850 such as with a bridge for a local or a wide area network, and a modem 852. By connecting the system bus 802 to various communication devices, external access to information can be obtained. The multimedia controller 826 will generally include a video graphics controller capable of displaying images upon the monitor 860, as well as providing audio to external components (not illustrated). Generally, the embodiments of the present disclosure can be used within system 800, such as within the central processing unit 820, to provide improved timing of control signal. Additionally, a system such as system 800 could be utilized to execute the method described herein.

Another embodiment is implemented as a program product for implementing a circuit design tool and a circuit simulation tool such as tools described with reference to FIGS. 2 and 7. The program(s) of the program product defines functions of the embodiments (including the methods described herein) and can be contained on a variety of data and/or signal-bearing media. Illustrative data and/or signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet and other networks. Such data and/or signal-bearing media, when carrying computer-readable instructions that direct the functions, represent embodiments.

In general, the routines executed to implement the embodiments, may be part of an operating system or a specific application, component, program, cell, object, or sequence of instructions. The computer program of the present invention typically is comprised of a multitude of instructions that will be translated by a computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature that follows is used merely for convenience, and thus embodiments should not be limited to use solely in any specific application identified and/or implied by such nomenclature.

It will be apparent to those skilled in the art having the benefit of this disclosure that, embodiments contemplate methods and arrangements to enhance a power management system of an IC. It is understood that the form of the embodiments shown and described in the detailed description and the drawings are to be taken merely as examples. It is intended that the following claims be interpreted broadly to embrace all the variations of the example embodiments disclosed.

Although the present disclosure and some of its advantages have been described in detail for some embodiments, it should be understood, that various changes, substitutions and alterations can be made herein without departing from the spirit and scope of the disclosure as defined by the appended claims. Although specific embodiments may achieve multiple objectives, not every embodiment falling within the scope of the attached claims will achieve every objective. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A circuit comprising:
    a first group of functionally distinct integrated circuit components configured to be operable during a first time period and to be inactive during at least a portion of a second time period;
    a second group of functionally distinct integrated circuit components configured to be inactive during at least a portion of the first time period and operable during the second time period; and
    a power cell located in an area of the circuit proximate to the first group and the second group and coupled with the first group and the second group to supply power to the first group and the second group, wherein the power cell is sized based upon power requirements of the first group, wherein the power cell comprises a power switching component adapted to suppress power supplied to the first group of functionally distinct integrated circuit component when the at least a portion of the second time period occurs and to suppress power supplied to the second group of functionally distinct integrated circuit components when the at least a portion of the first time period occurs.

2. The circuit of claim 1, further comprising a power control component coupled with the power cell, wherein the first group and the second group have operational overlap and the power cell is adapted to power the first group and the second group via the power control component by controlling the power switching component to supply power to the first group of functionally distinct integrated circuit components and the second group of functionally distinct integrated circuit components in a staggered fashion.

3. The circuit of claim 1, wherein the first group of functionally distinct integrated circuit component comprises at least one static random access memory (SRAM) cell and the second group of functionally distinct integrated circuit component comprises at least one SRAM cell.

4. The circuit of claim 1, wherein the first group of functionally distinct integrated circuit component comprises a first group of register cells and the second group of functionally distinct integrated circuit component comprises a second group of register cells.

5. The circuit of claim 1, wherein the first group of functionally distinct integrated circuit component comprises at least a first cell adapted to receive a signal from a first leg of a signal branching circuit and the second group of functionally distinct integrated circuit components comprises at least a second cell adapted to receive a signal from a second leg of the signal branching circuit.

6. The circuit of claim 1, wherein the first group of functionally distinct integrated circuit components comprises a first portion of a multiplexer and the second group of functionally distinct integrated circuit components comprises a second portion of the multiplexer.

7. A circuit comprising:
a first integrated circuit component;
a second integrated circuit component wherein the first and second integrated circuit components operate at least partially during non-overlapping time periods; and
a power cell located in an area of the circuit proximate to the first integrated circuit and the second integrated circuit and coupled with the first integrated circuit and the second integrated circuit to supply power to the first integrated circuit and the second integrated circuit, wherein the power cell is sized based upon power requirements of the first integrated circuit, wherein the power cell comprises a power switching component having a first power switch to supply power to the first integrated circuit component and a second power switch to supply power to the second integrated circuit component.

8. The circuit of claim 7, further comprising a power control cell coupled with the power switching component to suppress power to the first integrated circuit component via the first power switch while the first integrated circuit component is inactive.

9. The circuit of claim 7, wherein the first integrated circuit component comprises at least one static random access memory (SRAM) cell and the second integrated circuit component comprises at least one SRAM cell.

10. The circuit of claim 7, wherein the first integrated circuit component comprises a first group of register cells and the second integrated circuit component comprises a second group of register cells.

11. The circuit of claim 7, wherein the first integrated circuit component comprises at least a first cell adapted to receive a signal from a first leg of a signal branching circuit and the second integrated circuit component comprises at least a second cell adapted to receive a signal from a second leg of the signal branching circuit.

12. The circuit of claim 7, wherein the first integrated circuit component comprises a signal processing cell and the second integrated circuit component comprises signal processing cell.

13. The circuit of claim 7, further comprising a power control cell coupled with the power cell, the first integrated circuit and the second integrated circuit have operational overlap, wherein the power control cell is adapted to power, via the power cell and the power switching component, the first integrated circuit and the second integrated circuit by controlling the power switching component to supply power to the first integrated circuit and the second integrated circuit in a staggered fashion.

* * * * *